(12) United States Patent
Hynecek

(10) Patent No.: US 9,094,612 B2
(45) Date of Patent: Jul. 28, 2015

(54) BACK SIDE ILLUMINATED GLOBAL SHUTTER IMAGE SENSORS WITH BACK SIDE CHARGE STORAGE

(71) Applicant: Semiconductor Components Industries, LLC, Phoenix, AZ (US)

(72) Inventor: Jaroslav Hynecek, Allen, TX (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 52 days.

(21) Appl. No.: 14/035,794

(22) Filed: Sep. 24, 2013

(65) Prior Publication Data

US 2014/0085523 A1 Mar. 27, 2014

Related U.S. Application Data

(60) Provisional application No. 61/705,595, filed on Sep. 25, 2012.

(51) Int. Cl.
| | |
|---|---|
| H01L 27/146 | (2006.01) |
| H04N 5/341 | (2011.01) |
| H04N 5/3745 | (2011.01) |
| H04N 5/363 | (2011.01) |
| H04N 5/235 | (2006.01) |

(52) U.S. Cl.
CPC ............ H04N 5/235 (2013.01); H01L 27/1461 (2013.01); H01L 27/1464 (2013.01); H01L 27/14605 (2013.01); H01L 27/14612 (2013.01); H01L 27/14638 (2013.01); H04N 5/341 (2013.01); H04N 5/363 (2013.01); H04N 5/3745 (2013.01)

(58) Field of Classification Search
CPC ....... H04N 5/361; H04N 5/363; H04N 5/341; H04N 5/3745; H01L 27/14609
USPC ......... 348/308, 241, 243, 248, 294, 299, 300; 257/291; 250/208.1
See application file for complete search history.

(56) References Cited

U.S. PATENT DOCUMENTS

| | | | |
|---|---|---|---|
| 5,625,210 A | 4/1997 | Lee et al. | |
| 8,535,996 B2 | 9/2013 | Shaheen et al. | |
| 8,618,459 B2* | 12/2013 | Hynecek et al. | ............... 257/291 |
| 2009/0101798 A1* | 4/2009 | Yadid-Pecht et al. | ...... 250/208.1 |

(Continued)

OTHER PUBLICATIONS

Hynecek, U.S. Appl. No. 14/024,316, filed Sep. 11, 2013.

(Continued)

*Primary Examiner* — Nhan T Tran
(74) *Attorney, Agent, or Firm* — Treyz Law Group; Michael H. Lyons

(57) ABSTRACT

A back side illuminated image sensor may be provided with an array of image sensor pixels. Each pixel may include a substrate having a front surface and a back surface. The pixels may have a charge storage region at the back surface and a charge readout node at the front surface of the substrate. The pixels may receive light at the back surface. Photo-generated charge may be accumulated at the charge storage region during a charge integration cycle. Upon completion of the charge integration cycle, a transfer gate formed at the front surface may be pulsed high to move the charge from the charge storage region to the charge readout node using a global shutter algorithm. The pixels may include two reset transistors that are coupled to column feedback amplifier circuitry for mitigating kTC-reset noise when the pixels are operated in a global shutter mode.

21 Claims, 5 Drawing Sheets

(56) References Cited

U.S. PATENT DOCUMENTS

| | | | |
|---|---|---|---|
| 2009/0201400 A1* | 8/2009 | Zhang et al. | 348/296 |
| 2010/0276574 A1 | 11/2010 | Manabe | |
| 2012/0235212 A1* | 9/2012 | Chen et al. | 257/223 |
| 2012/0273653 A1 | 11/2012 | Hynecek | |
| 2012/0273654 A1 | 11/2012 | Hynecek et al. | |
| 2013/0153973 A1 | 6/2013 | Hynecek | |
| 2013/0334637 A1* | 12/2013 | WANG et al. | 257/432 |

OTHER PUBLICATIONS

Hynecek et al., U.S. Appl. No. 13/086,363, filed Apr. 13, 2011.

Lenchenkov, U.S. Appl. No. 13/964,462, filed Aug. 12, 2013.

Takayanagi et al., "A Four-Transistor Capacitive Feedback Reset Active Pixel and its Reset Noise Reduction Capability", Advances Technology Research Center.

Yasutomi et al., "A 2.7e—Temporal Noise 99.7% Shutter Efficiency 92dB Dynamic Range CMOS Image Sensor with Dual Global Shutter Pixels", International Solid-State Circuits Conference, Session 22, Image Sensors, 2010 IEEE, Feb. 10, 2010.

"Sony Develops Next-generation Back-Illuminated CMOS Image Sensor which Embodies the Continuous Evolution of the Camera", Sony Corp. Info, [online], Jan. 23, 2012. <http://www.sony.net/SonyInfo/News/Press/201201/12-009E/>.

* cited by examiner

BACK SIDE ILLUMINATED GLOBAL SHUTTER IMAGE SENSORS WITH BACK SIDE CHARGE STORAGE

This application claims the benefit of provisional patent application No. 61/705,595, filed Sep. 25, 2012, which is hereby incorporated by reference herein in its entirety.

BACKGROUND

This relates to solid-state image sensor arrays and, more specifically, to image sensors with small size pixels that are illuminated from the back side of a pixel substrate. Small pixel sizes reduce the cost of manufacturing image sensor arrays, but it is important not to sacrifice image sensor performance when pixel size is reduced.

Conventional complementary metal-oxide-semiconductor (CMOS) image sensors sense light by converting impinging photons into electrons that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can sometimes be converted on-chip to a digital equivalent before being conveyed off-chip. Each pixel includes a buffer amplifier (i.e., source follower) that drives output sensing lines that are connected to the pixels via respective address transistors.

After the charge-to-voltage conversion is complete and after the resulting signals are transferred out from the pixels, the pixels are reset before a subsequent integration cycle begins. In pixels that include floating diffusions (FD) serving as the charge detection node, this reset operation is accomplished by momentarily turning on a single reset transistor that connects the floating diffusion node to a voltage reference for draining (or removing) any charge transferred to the FD node. However, removing charge from the floating diffusion node using the reset transistor generates kTC-reset noise, as is well known in the art. This kTC noise must be removed using correlated double sampling (CDS) signal processing techniques in order to achieve desired low noise performance. Typical CMOS image sensors that utilize CDS require at least three transistors (3T) or four transistors (4T) per pixel. An example of the 4T pixel circuit with a pinned photodiode can be found in Lee (U.S. Pat. No. 5,625,210), incorporated herein as a reference.

A cross-sectional side view of a conventional pixel 100 is shown in FIG. 1. Pixel 100 is formed in substrate 101. Pixel substrate 101 includes p+ doped layer 102 deposited on the back surface of pixel substrate 101, which prevents the generation of excessive dark current by interface states. Substrate 101 includes epitaxial p-type doped layer 115 formed on top of p+ layer 102. Photons 90 that enter p-type doped layer 115 generate carriers that are collected in the potential well of the photodiode formed in region 108 at the front surface of substrate 101. The front (upper) surface of epitaxial p-type doped layer 115 is covered by oxide layer 109 that isolates doped poly-silicon charge transfer (TX) gate 110 from substrate 101. Transfer gate 110 includes masking oxide 111 deposited on an upper surface of transfer gate 110 that serves as a patterning hard mask as well as an additional blocking mask for ion implantation that forms the photodiode storage region.

The photodiode is formed by the p+ type doped potential pinning layer 107 and n-type doped layer 108 at the front surface of substrate 101. P+ type doped layer 107 reduces dark current generated by the interface states. Charge generated by impinging photons 90 is accumulated at region 108. Gate 110 includes sidewall spacers 116 formed on each side of gate 110 to control the mutual edge positions of p+ type doped layer 107 and charge storage layer 108. Floating diffusion (FD) diode 104 formed at the front surface of substrate 101 senses charge transferred from region 108 (i.e., as shown by arrow 121, charge is transferred from region 108 at the front side of pixel substrate 101 to region 104 at the front side of pixel substrate 101). Floating diffusion 104 is connected to a source follower (SF) transistor (not shown). The floating diffusion diode, source follower, and other pixel circuit components are built within p-type doped well 103.

The pixels are isolated from each other by p+ type doped regions 105 and 106 that may extend through epitaxial p-type doped layer 115 down to p+ type doped layer 102. The pixel is covered by inter-level (IL) oxide layers 112 (only one inter-level oxide layer is shown) that are used for the pixel metal wiring and interconnect isolation. The active pixel circuit components are connected to the wiring by metal via 114 deposited through contact holes 113.

As shown in drawing 100, a large portion of valuable pixel area is occupied by transfer gate 110. Other pixel circuit components (not shown) also occupy a large portion of the pixel, so there is not enough substrate area left for the photodiode that is disposed in a lateral direction from gate 110. This can lead to low photodiode charge storage capacity, poor pixel dynamic range, and poor noise performance.

These problems are amplified when pixel 100 is operated in a global shutter mode. To operate conventional pixel 100 in global shutter mode, an additional pinned diode and an additional transfer gate are typically formed at the front surface of substrate 101 adjacent to the photodiode formed by layers 107 and 108, as can be found in Yasutomi et al. (ISSCC Digest of Technical Papers, Feb. 10, 2010, pp. 398 and 399, entitled "A 2.7e Temporal Noise 99.7% Shutter Efficiency 92 dB Dynamic Range CMOS Image Sensor with Dual Global Shutter Pixels"). This is a modification of the well-known Interline Transfer Charge Coupled Device (CCD) concept, where charge from the pixel photodiodes is transferred first to vertical CCD registers located in the spaces between the pixels, then in parallel row-by-row to a serial register, which is then followed by a CCD transfer out to a common single charge detection node connected to an amplifier.

In conventional image sensors, kTC-noise reduction is sometimes performed using feedback capacitors formed within the pixel, as can be found in Takayanagi et al. (IEEE Workshop on Charge-Coupled Devices and Advanced Image Sensors, 2001, entitled "A Four-Transistor Capacitive Feedback Reset Active Pixel and its Reset Noise Reduction Capability"). However, when feedback is performed within the pixels, the pixel circuit components occupy an even greater portion of the pixel, which can lead to further reduction in photodiode charge storage capacity, pixel dynamic range, and noise performance.

In some cases, two pixel substrates are stacked on top of each other, with one substrate having a built in photodiode and the other substrate carrying the rest of the pixel circuits. An example of two substrate stacked pixel a can be found in http://www.sony.net/SonyInfo/News/Press/201201/12-009E/ by Sony. However, when stacking the two substrates, the substrates must be electrically connected using wafer-to-wafer contacts and must be precisely aligned, resulting in increased fabrication difficulty and high manufacturing costs.

It would therefore be desirable to be able to provide improved image sensors without a stacking requirement.

DETAILED DESCRIPTION

Figure 1:
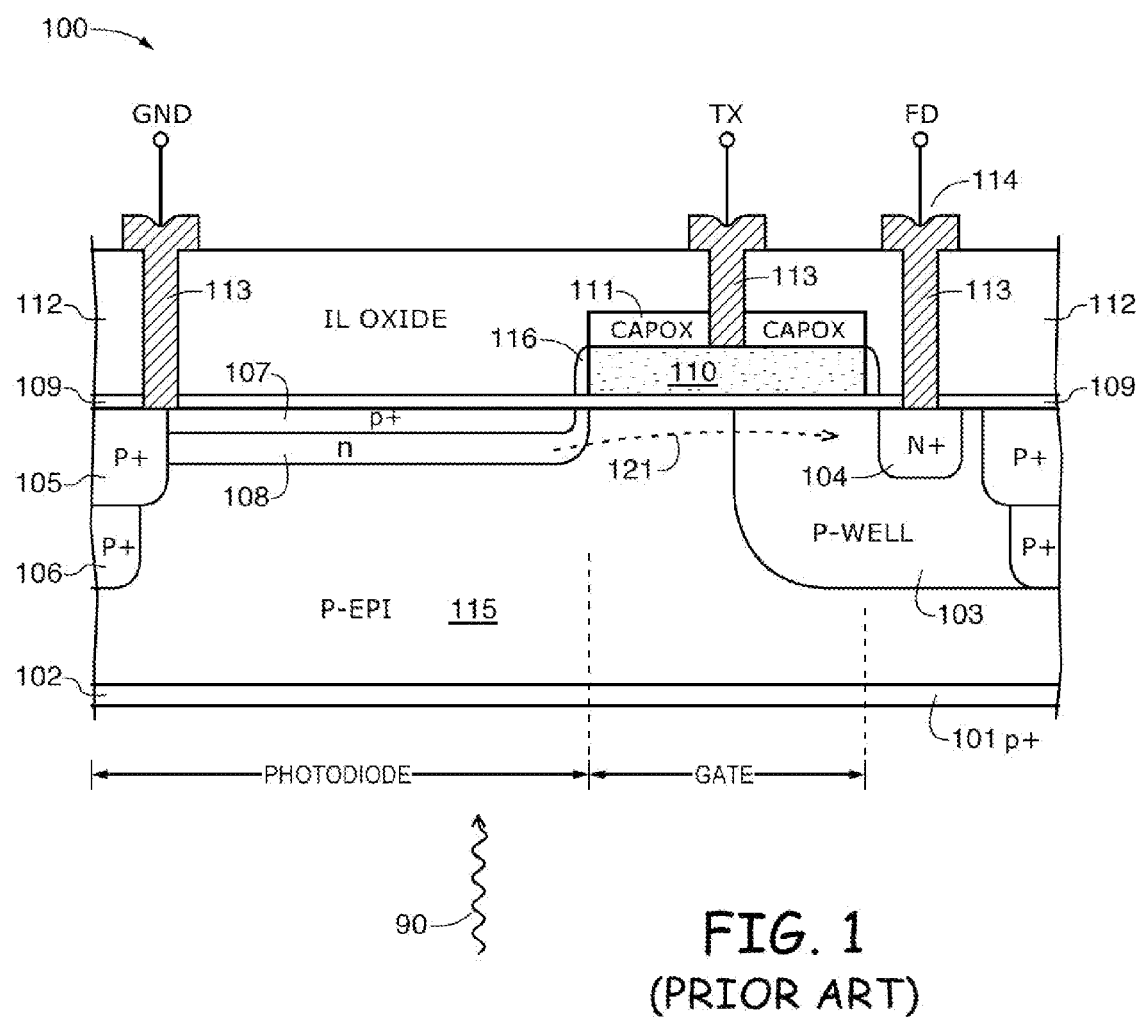
FIG. 1 is a cross-sectional side view of a conventional image sensor pixel having a charge storage region and a floating diffusion diode at the front-side of a pixel substrate.
Figure 2:
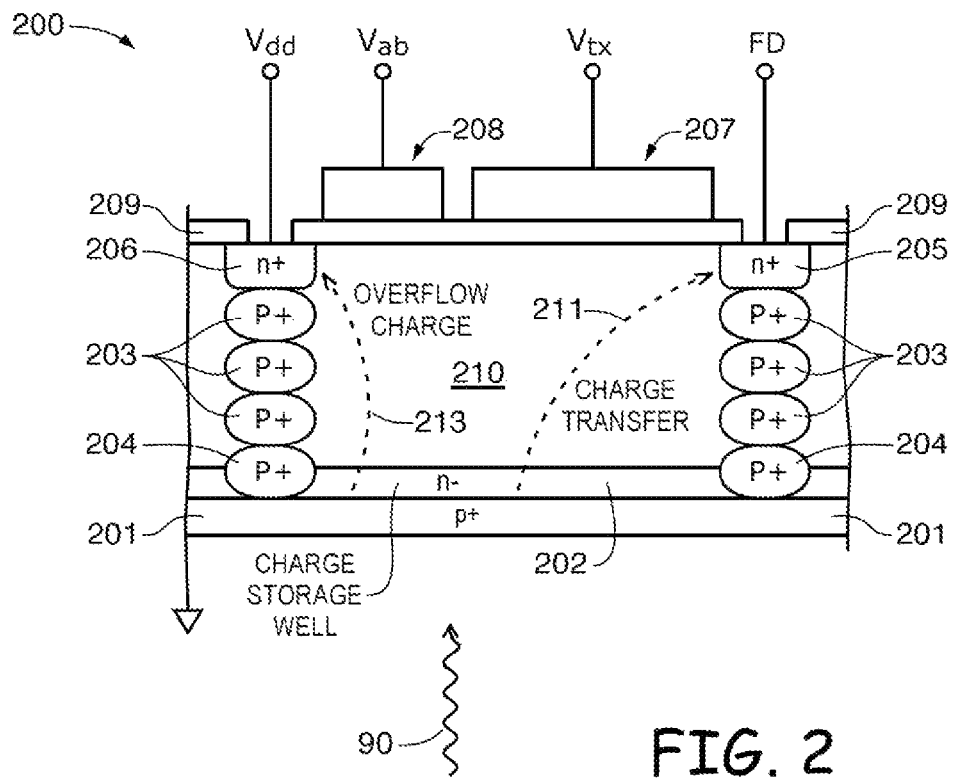
FIG. 2 is a cross-sectional side view of an illustrative image sensor pixel having charge storage well doping at the back side of a pixel substrate, back side potential pinning doping, a front side anti-blooming control gate, a front side charge transfer gate, a front side overflow charge drain, and a front side floating diffusion node in accordance with an embodiment of the present invention.

In FIG. 2, drawing 200 shows cross-sectional side view of an illustrative back-side illuminated (BSI) image pixel (sometimes referred to herein as image pixel 200). An image sensor may be formed from an array of pixels such as pixel 200 arranged in rows and columns. The image sensor pixels may be fabricated on a substrate such as substrate 210. Substrate 210 has a top (front) surface and a bottom (back) surface. Image sensing circuitry such as transistors and interconnect structures may be formed on the front side of substrate 210. A p+ type doping layer such as p+ doping layer 201 may be formed (deposited) on the bottom surface of substrate 210. P+ type doping layer 201 may suppress dark current generated by interface states.

During operation, image photons 90 may be received by the image sensing means through the back side of substrate 210 (sometimes referred to herein as the rear surface or back surface of substrate 210). In particular, the rear surface of the pixel array (i.e., the back side of semiconductor substrate 210) may be exposed to an image to be captured. Photons 90 may enter substrate 210 through the back surface and generate carriers (e.g., electron-hole pairs) in region 210.

An n− type doping layer such as n− type doping layer 202 may be formed at the back side of substrate 210 (e.g., n− type doping layer 202 may be formed at the upper surface of p+ type doping layer 201). A potential well may be formed at n− type doped layer 202 and n− type doped layer 202 may collect photon-generated carriers (e.g., carriers generated at region 210 in response to image photons 90). N− type doped layer 202 formed at the back side of substrate 210 may result in the formation of a potential well sometimes referred to herein as a charge storage well.

P-type implants (e.g., p+ type doped regions) 203 may be formed in substrate 210 to isolate each pixel in the array from each other. P-type implant 204 may be formed at least partially within back side n− type doping layer 202 to separate the charge storage wells of multiple pixels in the pixel array from each other and to prevent charge from multiple pixels from mixing together (e.g., to prevent pixel cross talk).

Charge transfer gate 207 (e.g., a polysilicon gate structure, a metal gate structure, or other types of conductive gate structures) may be formed on the front surface of substrate 210. A charge readout node may be formed at the front surface of substrate 210. The charge readout node may include floating diffusion (FD) 205 formed at the front side of substrate 210 (e.g., an n+ type doped floating diffusion region). Charge transfer gate 207 may receive charge transfer control signal Vtx (e.g., from pixel control circuitry that is not shown for the sake of simplicity). During operation, charge transfer gate 207 is normally biased low (e.g., transfer gate control signal Vtx is normally biased low). For example, charge transfer gate 207 may be biased low during a charge integration cycle in which charge (e.g., photon-generated carriers) is stored at n− type doping layer 202. When charge transfer gate 207 is momentarily pulsed high (e.g., during a charge transfer cycle), charge from back side storage well 202 is transferred to front side floating diffusion 205 (as shown by arrow 211) and the corresponding voltage signal may be readout (e.g., by pixel readout circuitry coupled to node 205 that is not shown for the sake of simplicity).

Anti-blooming control gate 208 (e.g., a polysilicon gate structure, a metal gate structure, or other types of conductive gate structures) is formed on the front surface of substrate 210. Anti-blooming control gate 208 (sometimes referred to herein as blooming control gate 208) may be laterally separated from charge transfer gate 207. Drain diffusion 206 (e.g., an n+ type doped drain diffusion region) may be formed at the front surface of substrate 210 adjacent to anti-blooming control gate 208. Anti-blooming control gate 208 may receive anti-blooming gate control signal $V_{ab}$ from the pixel control circuitry. Anti-blooming control gate 208 may be biased at an intermediate bias level during the charge integration cycle (e.g., control signal $V_{ab}$ may be biased at an intermediate bias level that is less than the high bias level and greater than the low bias level), allowing overflow charge stored at a potential well formed in region 202 to flow into drain diffusion 206, as shown by arrow 213. Anti-blooming control gate 208 may be biased low during the charge transfer cycle, preventing charge from flowing to drain diffusion 206.

Gate oxide layer 209 may be interposed between substrate 210 and gates 207 and 208. Gates 207 and 208 may be isolated from substrate 210 by gate oxide layer 209. Gate oxide layer 209 may substantially cover the entire surface of the pixel array. Metal interconnect wiring layers may be formed over the front side of substrate 210 and may be used to supply pixel control signals to the pixels (e.g., to supply signals $V_{ab}$ and Vtx to gates 208 and 207, respectively). Additional inter-level dielectric layers (not shown) may be deposited over gates 207 and 208 to isolate the metal interconnect wiring layers. Each pixel 200 may include source follower transistors, addressing transistors, and reset transistors (e.g., source follower transistors, addressing transistors, and reset transistors may be formed at the front surface of substrate 210).

By storing charge in the potential well formed in region 202 located at the back side of substrate 210, pixel 200 of FIG. 2 may minimize the pixel area occupied by transfer gate 207 and other pixel circuitry (e.g., charge storage region 202 may extend between pixel isolation implants 204 formed at opposing sides of pixel 200). During pixel readout, charge may be transferred from the charge storage well in region 202 at the back side of substrate 210 to the front side of substrate 210 where it is stored at floating diffusion node 205. The charge may be subsequently converted to a voltage equivalent at floating diffusion node 205. Signal processing circuits (e.g., feedback amplifier circuitry, active negative capacitance circuitry etc.) may be coupled to the pixel shown in drawing 200. An input terminal of the signal processing circuits may be coupled to node 205. Voltage signals may be transferred to the signal processing circuits during readout and may be read out.

Figure 3:
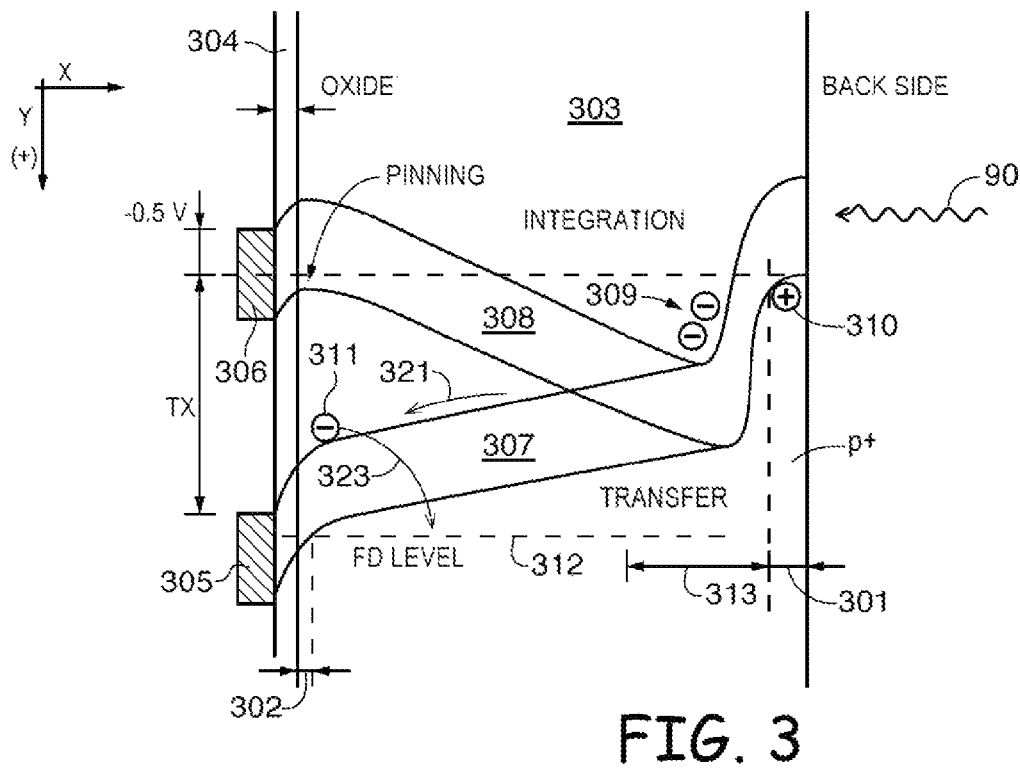
FIG. 3 is an illustrative potential diagram across a pixel of the type shown in FIG. 2 that shows how charge is stored at the back side of the pixel substrate during a charge integration period and how charge flows during charge transfer to a floating diffusion at the front side of the pixel substrate for readout in accordance with an embodiment of the present invention.

FIG. 3 is an illustrative potential diagram illustrating the potential profile of a pixel such as image sensor pixel 200 of FIG. 2 during operation. The drawing in FIG. 3 illustrates the flow of electrons as they move through the cross-section of the pixel structure shown in FIG. 2, from back side charge storage layer 202 to floating diffusion 205. As shown in FIG. 3, the pixel may be built into low-doped semiconductor material 303 (e.g., silicon). For example, region 303 may correspond to substrate 210 of FIG. 2. In scenarios where region 303 is a p-type material, most of region 303 may be completely depleted of holes. An un-depleted p+ potential pinning layer 301 may be deposited on the back side of region 303 to prevent generation of dark current from interface states by accumulating holes 310 at pinning layer 301.

A potential well may be formed at n-type doped region 313 (e.g., a region formed by an n-doped material such as region 202 formed at the back side of substrate 210 of FIG. 2). During the charge integration cycle, charge transfer gate 207 may be biased low at level 306. When charge transfer gate 207 is biased to low level 306, the silicon energy bands are at position 308 and the potential profile forms a potential well 309 in which electrons are accumulated. During the charge transfer cycle, charge transfer gate 207 may be biased high at level 305. When charge transfer gate 207 is biased at high level 305, the silicon energy bands are shifted to position 307 and electrons will flow from region 309 to region 311 under the charge transfer gate, as shown by arrow 321. Electrons at region 311 may subsequently flow from region 311 to the floating diffusion region (e.g., floating diffusion 205 of FIG. 2), which is biased at level 312 (e.g., as shown by arrow 323).

Oxide layer 304 may isolate the gates from substrate 303 (e.g., oxide layer 304 may correspond to oxide layer 209 of FIG. 2). Additional p-type doped region 302 may be implanted under the gates to prevent generation of dark current when charge transfer gate 207 is biased low. Other pixel structures shown in FIG. 2 such as a potential profile under blooming control gate 208, are not shown for the sake of simplicity. Various IL metal layers and metal interconnect layers on top of the pixel are also not shown for the sake of simplicity. If desired, various dielectric layers, light shields, color filters, micro-lenses, or any other desired image sensor components may be formed over the back side of substrate 303 (e.g., where light 90 enters substrate 303), and are not shown for the sake of simplicity.

The example of FIGS. 2 and 3 is merely illustrative. If desired, substrate 210 may be formed from any other desired semiconductor materials. For example, substrate 210 (region 303) may be formed from a lightly doped n-type material or from a lightly doped p-type material. In scenarios where region 303 is formed from a lightly doped n-type material, photo-generated holes may be accumulated at potential well region 309. In this scenario, the doping of floating diffusion 205 and anti-blooming drain 206 is replaced with p+ type doping (e.g., the doping polarity shown in FIG. 2 would be reversed). If desired, n-type and/or p-type implants may be formed throughout the silicon under charge transfer gate 207 to suitably shape the potential profile in this region and to achieve complete charge transfer without any carrier trapping in parasitic wells.

In scenarios where pixel 200 is operated using a rolling shutter mode, each pixel in the pixel array transfers charge and is read out on a row-by-row basis. In these scenarios, node 205 is reset using a single reset transistor and a reset voltage on node 205 is detected and stored in storage circuitry (e.g., storage circuitry formed at the periphery of the array) prior to transferring charge. Charge stored at back side storage region 202 is subsequently transferred to floating diffusion node 205. After charge is transferred from back side storage well 202 to floating diffusion node 205, a second voltage is read out from node 205 and the previously stored reset voltage is subtracted from the second voltage. This procedure is sometimes referred to as correlated double sampling (CDS). By performing CDS, pixel 200 may eliminate kTC-reset noise, since only a voltage difference resulting from transferred charge may result in a valid image signal. Performing this type of kTC-reset noise mitigation using a single reset transistor in each pixel may be unsuitable for pixels 200 that are operated in a global shutter mode.

If desired, charge transfer and readout from pixel 200 may be performed using a global shutter mode, in which charge is transferred from the back side charge storage well in region 202 at the back side of substrate 210 to front side storage node 205 simultaneously for the pixels in each row of the pixel array. When pixels 200 are to be operated in global shutter mode (e.g., when charge is transferred from back side storage region 202 to front side storage node 205 based on a global shutter algorithm), pixels 200 may include dual reset transistors (e.g., two reset transistors each having gates that are coupled to respective reset lines) that are coupled to column feedback amplifier circuitry for mitigating kTC-reset noise in the captured image signal. If desired, the column feedback amplifier circuitry may be formed separately from pixel 200 (e.g., on the front surface of the pixel array, on the front surface of substrate 210, at the periphery of the pixel array, between pixels in the pixel array, etc.).

Figure 4:
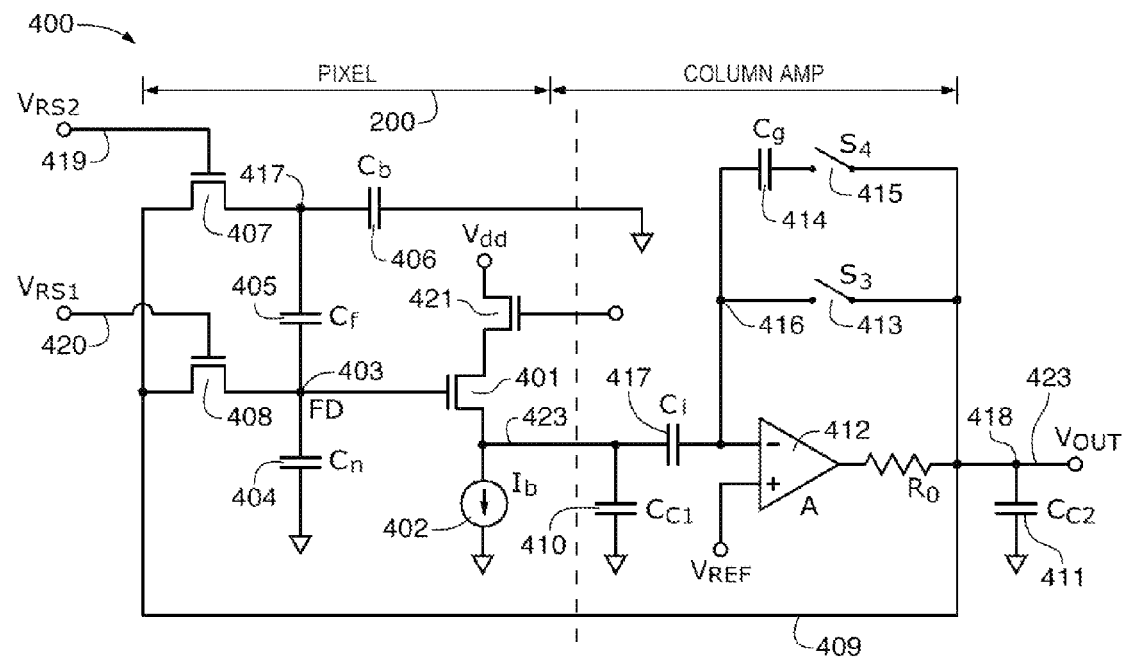
FIG. 4 is an illustrative circuit diagram of a pixel of the type shown in FIG. 2 having dual reset transistors that are coupled to column feedback amplifier circuitry for performing kTC-reset noise reduction in a global shutter mode in accordance with an embodiment of the present invention.

In FIG. 4, drawing 400 is an illustrative circuit diagram of backside illuminated pixel circuitry having back side charge storage such as pixel 200 of FIG. 2. Pixel 200 may be coupled to a pixel column output signal line 423. As shown in FIG. 4, transistor 401 is the source-follower for pixel 200. The source of source follower transistor 401 may be coupled to pixel column output signal line 423. Column output signal line 423 may be biased using column current source 402. Column output signal line 423 may have a parasitic capacitance $C_{C1}$, as shown by capacitor 410. Pixel 200 may be coupled to column feedback amplifier circuitry such as column feedback amplifier 412 via column output signal line 423. For example, column output signal line 423 may be coupled to inverting input node 416 of column feedback amplifier 412 through coupling capacitor 417 (e.g., a coupling capacitor 417 having capacitance $C_i$).

The drain of source-follower transistor 401 may be coupled to row select transistor 421 (sometimes referred to herein as pixel address transistor 421). The drain of source-follower transistor 401 may receive pixel bias voltage $V_{dd}$ through row select transistor 421. This example is merely illustrative. If desired, row select transistor 421 may be coupled to the source of source-follower transistor 401. The gate of source-follower transistor may be coupled to floating diffusion node 403 (e.g., a floating diffusion node such as node 205 of FIG. 2) that has an equivalent node capacitance C. (e.g., as shown by capacitor 404). Floating diffusion node 403 may receive photo-accumulated charge from the back side storage well in region 202 using transfer gate 207 during the charge transfer cycle (charge transfer gate 207 and the back side charge storage well in region 202 are not shown for the sake of simplicity).

Pixel 200 may include two reset transistors 408 and 407 formed at the front surface of substrate 210 (e.g., a first reset transistor 408 and a second reset transistor 407 formed at the front side of substrate 210). Floating diffusion 403 may be coupled to first reset transistor 408. The gate of first reset transistor 408 may be coupled to first row reset line 420 and may receive first reset control signal $V_{RS1}$ over first row reset line 420. First reset transistor 408 may be coupled to output node 418 of feedback amplifier 412 via feedback line 409. Feedback amplifier 412 may supply an output voltage on feedback line 409. When first row reset line 420 is momentarily pulsed positive (e.g., when first reset control signal $V_{RS1}$ is momentarily pulsed positive), floating diffusion node 403 may be reset during a first reset operation to the voltage level supplied to column feedback line 409 by feedback amplifier 412 at that time.

Floating diffusion node 403 may be coupled to intermediate node 417 through coupling capacitor 405. Capacitor 405 may have capacitance $C_f$. Node 417 may be bypassed to ground or to a suitable voltage reference such as the power supply line (e.g., to a ground power supply line or a Vdd power supply line) by bypass capacitor 406 (e.g., a capacitor 406 having capacitance $C_b$). Node 417 may be coupled to second reset transistor 407. The gate of second reset transistor 407 may be coupled to second row reset line 419 and may receive second reset control signal $V_{RS2}$ over second row reset line 419. Second row reset line 419 may be maintained at a high bias level during the time when first reset line 420 is pulsed high and released back to a low bias level, allowing a feedback voltage correction for reducing kTC-reset error of the first reset operation supplied from the amplifier 412 to be stored on capacitor $C_b$ (e.g., node 417 may be reset to the reset voltage level supplied by feedback amplifier 412 including a kTC-reset noise correcting voltage associated with the reset operation performed by first reset transistor 408).

Column feedback line 409 may have a parasitic capacitance $C_{C2}$ (e.g., as shown by capacitor 411). Column feedback amplifier 412 may have gain A and output resistance $R_0$. As an example, gain A may be on the order of 20-100 and output resistance $R_0$ of feedback amplifier 412 may be on the order of 1 kOhm. The non-inverting input of column feedback amplifier 412 may be coupled to reference voltage $V_{REF}$. Column feedback amplifier 412 may have two feedback loops. A first feedback loop of amplifier 412 may be activated when first switch 413 is momentarily closed (e.g., when switch 413 is momentarily turned on when first switch signal $S_3$ is biased high). Amplifier 412 may be provided with unitary gain by momentarily closing first switch 413 and as a result, input node 416 of amplifier 412 may reset to reference voltage $V_{REF}$. A second feedback loop of amplifier 412 through gain capacitor 414 having capacitance $C_g$ may be activated when switch 415 is closed (e.g., when second switch signal $S_4$ is biased high). The ratio of capacitances $C_f/C_g$ may determine the gain of amplifier 412 when the pixel signal is being sensed. Pixel output signal $V_{OUT}$ may be provided to node 418 on column signal output line 423 and may be subsequently processed using a CDS signal processing technique.

Figure 5:
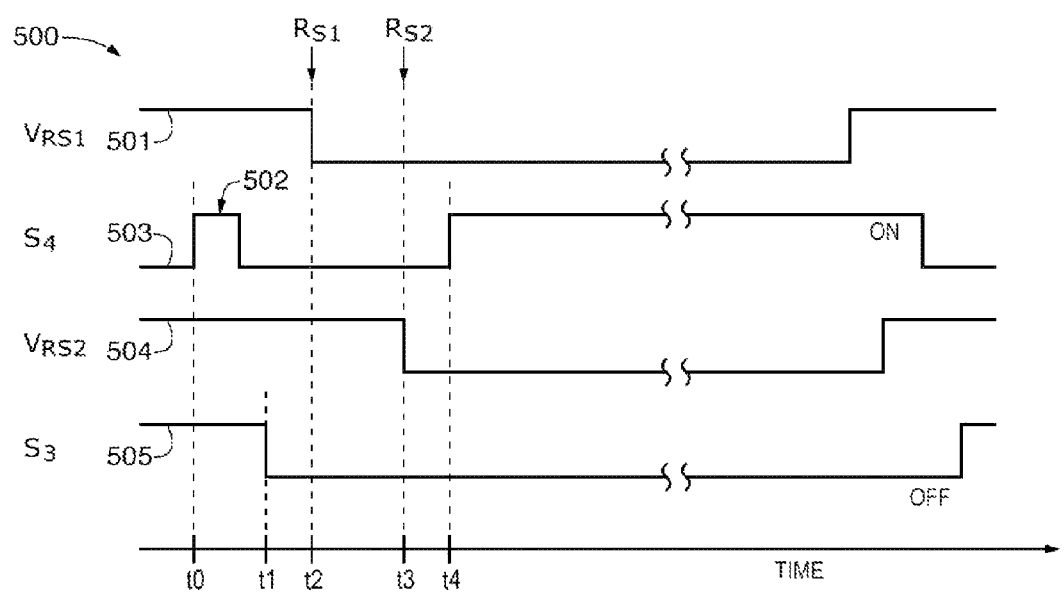
FIG. 5 is an example of a timing diagram illustrating how image sensor pixel circuitry of the type shown in FIG. 4 may be operated in accordance with an embodiment of the present invention.

An example of the timing pulses that may be applied to the image sensor pixel circuitry (e.g., the pixel and feedback amplifier circuitry) of FIG. 4 during a reset sequence for floating diffusion 403 is shown in FIG. 5. As shown in FIG. 5, waveform 503 represents the level of second switch signal $S_4$ that can be applied to second switch 415, waveform 505 represents the level of first switch signal $S_3$ that can be applied to first switch 413, waveform 501 represents the level of first reset signal $V_{RS1}$ that can be applied to first reset transistor 408, and waveform 504 represents the level of second reset signal $V_{RS2}$ that can be applied to second reset transistor 407 of FIG. 4. Second switch signal $S_4$ may be pulsed high at time t0 (e.g., as shown by pulse 502) to discharge gain capacitor 414, ensuring that no residual charge is stored on gain capacitor 414.

At time t1, switch 413 may be turned off by biasing first switch signal $S_3$ low. By turning off switch 413, the full open loop gain of column amplifier 412 may be activated for pixel 200 and the reset voltage of floating diffusion node 403 may be set to a predetermined level. At time t2, first reset transistor 408 may be turned off Turning off first reset transistor 408 may introduce kTC-reset noise on floating diffusion node 403. However, second reset transistor 407 remains on at time t2, and the feedback from column amplifier 412 introduced through column feedback line 409 and capacitor 405 may efficiently compensate for the kTC-reset noise on floating diffusion node 403.

At time t3, second reset transistor 407 is turned off. The noise voltage introduced onto intermediate node 417 by turning off second reset transistor 407 may be small (e.g., negligible), as the capacitance $C_b$ of bypass capacitor 406 can be relatively large. As a result, very little reset noise from the second reset operation is transferred to floating diffusion node 403 and floating diffusion node 403 is thereby reset without a significant kTC-reset noise contribution. Floating diffusion node 403 with its equivalent capacitance $C_n$ may subsequently receive photo-generated charge from back side storage well 202 (as shown in FIG. 2) and may store the received charge for readout. If desired, second switch 415 may be turned on prior to charge transfer (e.g., at time t4) to set the gain of feedback amplifier 412 to a value that is suitable for reading the anticipated image signal. In this way, kTC-reset noise may be mitigated in pixel 200 when pixel 200 is operated in a global shutter mode.

The example of FIGS. 4 and 5 is merely illustrative. If desired, multiple gain capacitors and switches such as capacitor 414 and switch 415 may be connected between input 416 and output 418 of feedback amplifier 412 (e.g., in the feedback loops of feedback amplifier 412) to dynamically adjust the gain of amplifier 412 according to the detected image signal to improve noise, provide an adaptive gain, and to simplify subsequent analog-to-digital conversion operations (details of this circuit are not shown in drawing 400 for the sake of simplicity).

Figure 6:
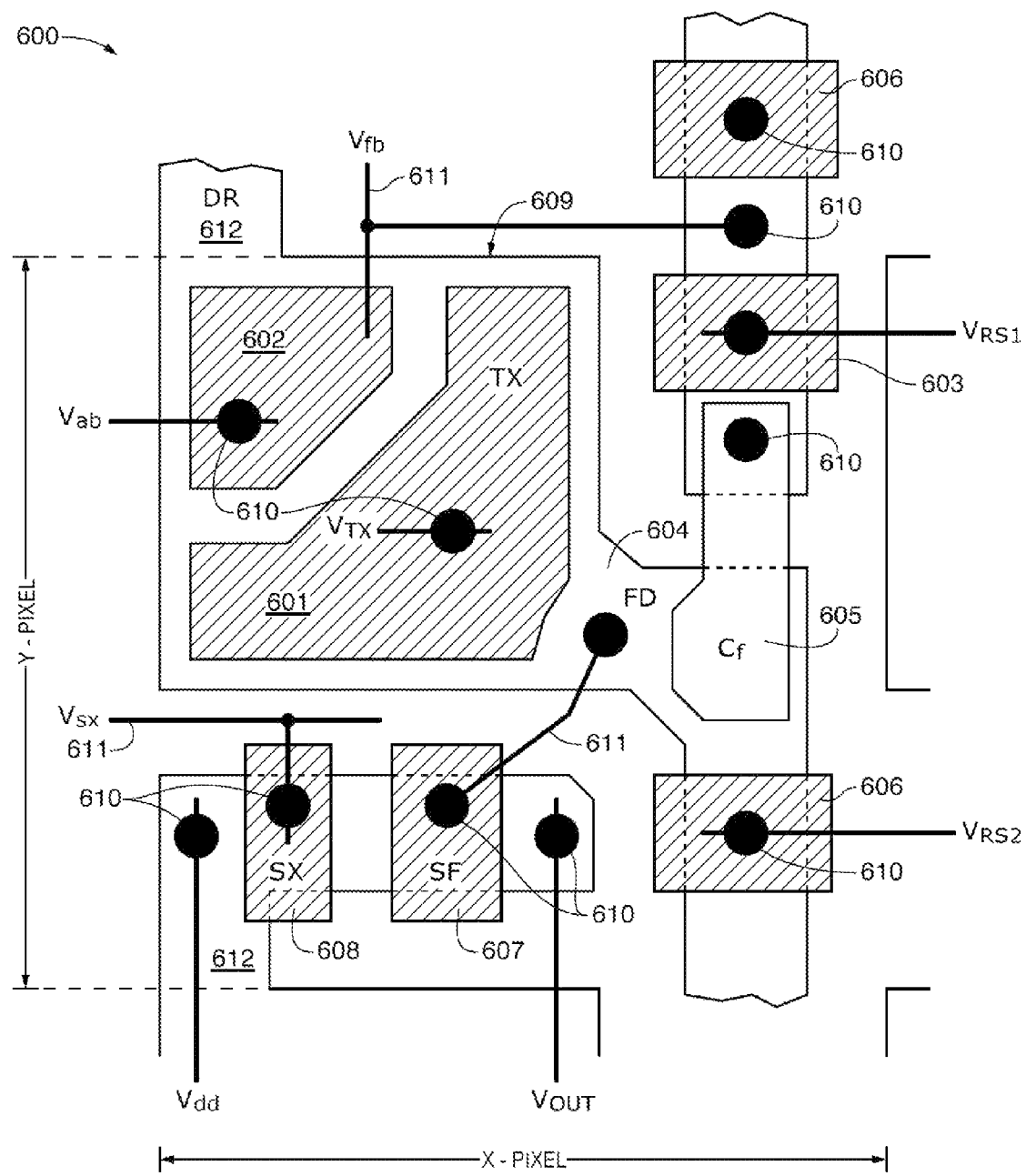
FIG. 6 is an illustrative layout for a pixel of the type shown in FIG. 4 having dual reset transistors for performing kTC-reset noise reduction in a global shutter mode in accordance with an embodiment of the present invention.

An illustrative layout topology for pixel circuit 200 is shown in drawing 600 of FIG. 6. As shown in FIG. 6, region 609 may delineate the active regions of the pixel and may include transfer gate region 601 (e.g., corresponding to transfer control gate 207 of FIG. 2), blooming control gate region 602 (e.g., corresponding to anti-blooming control gate 208 of FIG. 2), floating diffusion region 604 (e.g., corresponding to floating diffusion region 205 of FIG. 2), gate region 603 of first reset transistor 408 (e.g., as shown in FIG. 4), and gate region 606 of second reset transistor 407. The gate region of source follower transistor 401 is shown by region 607 and the gate region of row select (address) transistor 421 is shown by region 608 (the gate of row select transistor 421 may receive row select signal $V_{SX}$ from pixel control circuitry that is not shown for the sake of simplicity). Feedback capacitor 405 having capacitance $C_f$ is shown by region 605. Bypass capacitor 406 of FIG. 4 is not shown for the sake of simplicity (e.g., because capacitor 406 may be formed at higher metal levels than those shown by FIG. 6). Via connections from the metal pixel levels to the pixel circuit components are indicated by circles 610. Metal interconnects are shown schematically by lines 611. Anti-blooming drain 206 of FIG. 2 that is biased at bias level $V_{dd}$ is shown by region 612.

The example of FIG. 6 is merely illustrative. If desired, the pixel components shown in FIG. 6 may have any desired layout or arrangement. For example, pixel components such as anti-blooming drain 612 and/or anti-blooming gate 602 may be shared with neighboring pixels in the pixel array.

In large CMOS sensor arrays, a substantial parasitic capacitance may be present on the column sense lines coupled to each of the image sensor pixels. This parasitic capacitance may limit sensor readout speed. In the image sensor of FIGS. 2-6, where negative feedback is introduced into the pixel to eliminate the kTC-reset noise, parasitic capacitance may be aggravated since both a feedback line parasitic capacitance $C_{C2}$ (e.g., feedback line 409 of FIG. 4) and a column signal output line parasitic capacitance $C_{C1}$ (e.g., output line 423 of FIG. 4) may be present for each pixel. Parasitic capacitance on the column lines may be mitigated by connecting an active negative capacitance circuit to each column line. The active negative capacitance circuit may increase pixel readout speed at the cost of increasing power consumption.

Figure 7:
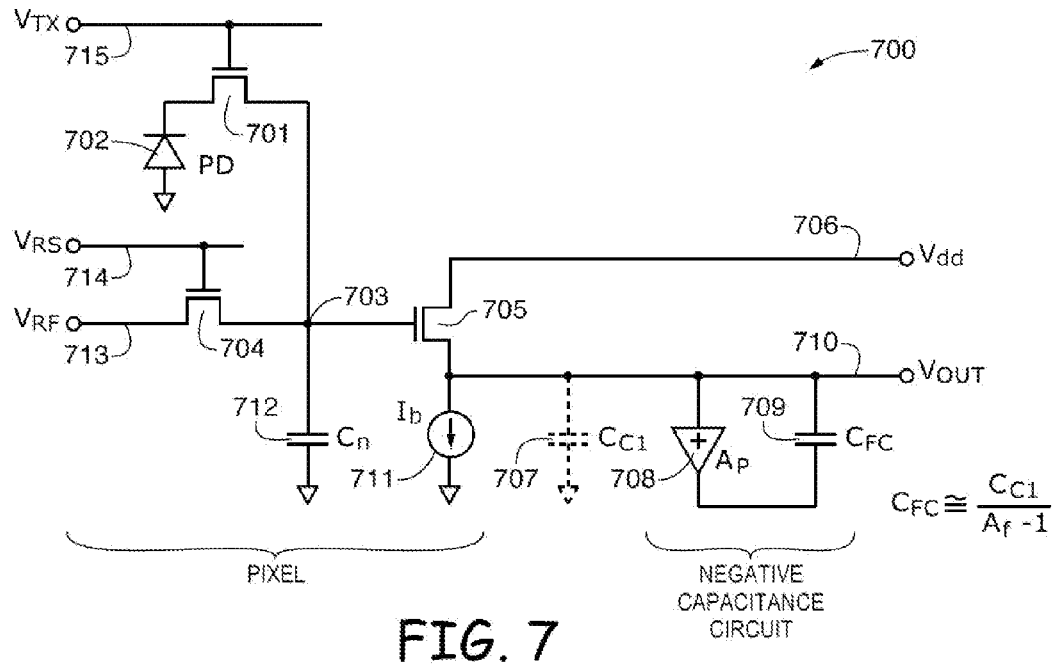
FIG. 7 is an illustrative circuit diagram of active negative capacitance circuitry that may be coupled to a column signal output line and/or to a pixel feedback line for mitigating parasitic capacitance in accordance with an embodiment of the present invention.

In FIG. 7, drawing 700 is an illustrative circuit diagram of an active negative feedback capacitance circuit that may be coupled to the column lines of pixel 200. Drawing 700 shows a 3T pixel configuration without any row select transistors for the sake of simplicity. In the example of FIG. 7, row addressing is accomplished using reset transistor 704 and by changing the reset voltage level $V_{RS}$ for each line 714. Addressed lines 713 have a higher reset voltage level $V_{RF}$ while the non-addressed lines are kept at the lower reset level $V_{RS}$ with the reset transistors turned on.

Charge transfer transistor 701 may transfer charge from photodiode (PD) 702 onto charge detection node 703 (e.g., floating diffusion node 703) to which the gate of source follower transistor 705 is connected. Charge detection node 703 has an equivalent capacitance $C_n$ (e.g., as shown by capacitor 212) that determines pixel charge conversion gain. Charge transfer is performed by momentarily pulsing the gate of charge transfer transistor 701 via row bus line 715. The drain of source follower transistor 705 is connected to column drain bus line 706, which is biased at level $V_{dd}$. The source of source follower transistor 705 is coupled to column signal line 710 that has column parasitic capacitance $C_{C1}$ (e.g., as shown by capacitor 707). Source follower transistor 705 is biased by constant current source 711 (e.g., having constant current $I_b$).

Column signal line 710 may include active negative capacitance circuitry. For example, active negative capacitance circuitry coupled to line 710 may include amplifier 708. Amplifier 708 may have gain $A_f$ and may have positive feedback through capacitor 709 (e.g., a capacitor 709 having capacitance $C_{FC}$) and line 710. Column parasitic capacitance $C_{C1}$ may be mitigated by the appropriate selection of gain $A_f$ and capacitance $C_{FC}$. For example, the column parasitic capacitance may be compensated for when $C_{FC}$ is selected to be approximately equal to $C_{C1}/(A_f-1)$. Active negative capacitance circuitry such as the negative capacitance circuitry of FIG. 7 may be formed on column signal lines and/or column feedback lines associated with each image sensor pixel (e.g., column feedback line 409 and/or column signal line 423 of FIG. 4 may include circuitry such as the active negative capacitance circuitry of FIG. 7). The active negative capacitance circuitry of FIG. 7 may accelerate the charging and discharging of column signal line 423 and/or feedback line 409 to accelerate scanning of the pixel array.

Figure 8:
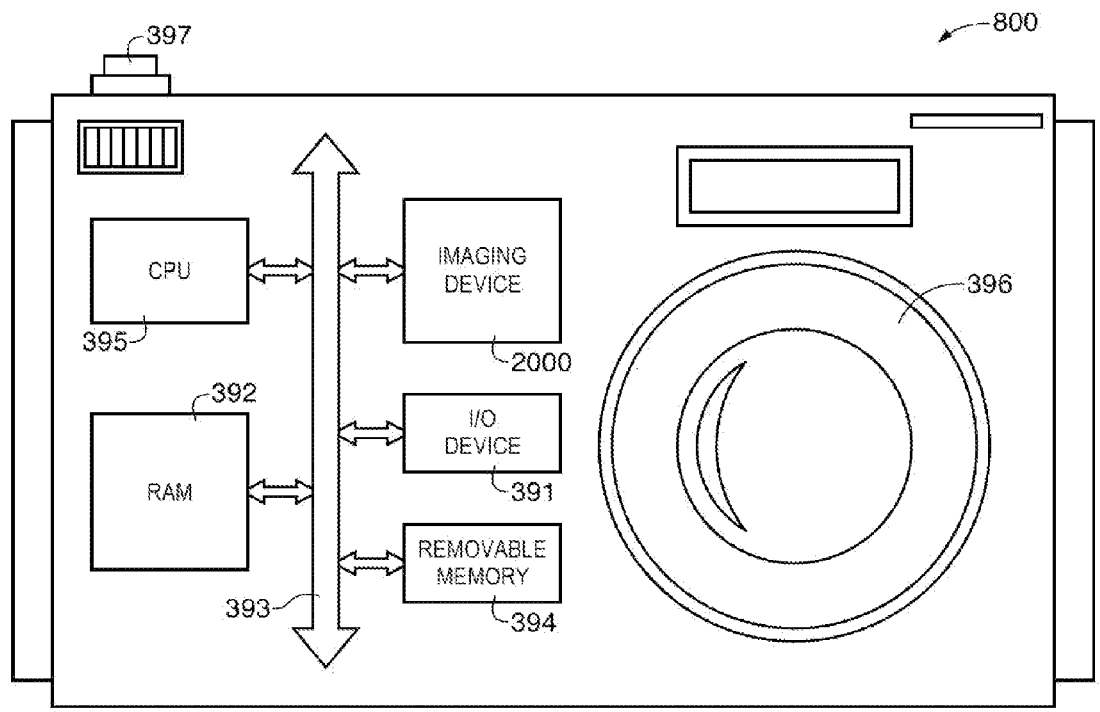
FIG. 8 is a block diagram of a processor system employing the image sensor of FIGS. 2-7 in accordance with an embodiment of the present invention.

FIG. 8 shows in simplified form a typical processor system 800, such as a digital camera, which includes an imaging device such as imaging device 2000 (e.g., an imaging device 2000 such as an image sensor that includes the backside illuminated global shutter pixels having back side charge storage regions as described above in connection with FIGS. 2-7). Processor system 800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 800, which may be a digital still or video camera system, may include a lens such as lens 396 for focusing an image onto a pixel array when shutter release button 397 is pressed. Processor system 800 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 2000 may also communicate with CPU 395 over bus 393. System 800 may include random access memory (RAM) 392 and removable memory 394. Removable memory 394 may include flash memory that communicates with CPU 395 over bus 393. Imaging device 2000 may be combined with CPU 395, with or without memory storage, on a single integrated circuit or on a different chip. Although bus 393 is illustrated as a single bus, it may be one or more buses or bridges or other communication paths used to interconnect the system components.

Having thus described the preferred embodiments of the novel pixel design that has the global shutter capability enabled by storing charge in a potential well located at the back side of a pixel substrate and transferring it for readout onto a floating diffusion node located at the front side of the substrate where the rest of the pixel circuits are located, where negative feedback from a column feedback amplifier may be used to eliminate kTC-reset noise, and an active negative capacitance circuit may be used to compensate for column sense and feedback line parasitic capacitances, it is noted that principles of this invention and various modifications can be made by those skilled in the art without departing from the scope and spirit of the invention.

Various embodiments have been described illustrating a back side illuminated image sensor pixel array that can operate in a global shutter mode. The image sensor pixel array may include image sensor pixel circuitry that includes a substrate having opposing front and back surfaces. The image sensor pixel array is illuminated with image light through the back surface.

The image sensor pixel circuitry can include a charge storage region formed at the back surface of the substrate that accumulates photo-generated charge during a charge integration cycle and a charge readout node (e.g., a floating diffusion node) formed at the front surface of the substrate. A charge transfer gate and an anti-blooming control gate may be formed at the front surface of the substrate. Charge may be accumulated and transferred using a global shutter algorithm. After completing the charge integration cycle for pixels in each row of the pixel array, charge from the back side charge storage region can be transferred to the front side charge readout node using the charge transfer gate for detection and conversion to a voltage. Forming the charge storage region at the back side of the pixel results in improved charge storage capacity, and in turn improved pixel dynamic range and noise performance.

First and second reset transistors may be formed on the front surface of the substrate and may be coupled to the charge readout node. The charge readout node may be coupled to column feedback amplifier circuitry through a source follower transistor and a column signal output line. The column feedback amplifier circuitry may supply an output voltage to the first and second transistors over a feedback line. Active negative capacitance circuitry may be coupled to the feedback line and/or the column signal output line to compensate for parasitic line capacitance and to accelerate line charging and discharging. If desired, the feedback amplifier may provide adjustable (adaptive) gain to image signals received from the charge readout node.

A coupling capacitor may be coupled between the second reset transistor and the charge readout node. The second reset transistor and the coupling capacitor may be coupled together at an intermediate circuit node. The first reset transistor may reset the charge readout node to a reset voltage (e.g., a reset voltage received over feedback line 409) during a first reset operation and the second reset transistor may reset the intermediate node during a second reset operation to a voltage level that includes the voltage necessary for correcting kTC-reset noise of the first reset operation, where this corrective signal is supplied by the column feedback amplifier. During the pixel reset cycle, the feedback amplifier may receive signals from the source follower and a reference bias voltage at its inputs and may supply an output signal to the pixel (e.g., to the first and second reset transistors) to compensate for pixel kTC-reset noise. In this way, voltage signals may be read out from the image sensor pixel circuitry using a global shutter mode and with minimal kTC-reset noise.

The foregoing is merely illustrative of the principles of this invention and various modifications can be made by those skilled in the art without departing from the scope and spirit of the invention. The foregoing embodiments may be implemented individually or in any combination.

What is claimed is:

1. Image sensor pixel circuitry comprising:
   a substrate having opposing front and back surfaces;
   a charge storage region formed at the back surface of the substrate, wherein the charge storage region is configured to accumulate photo-generated charge;
   a charge readout node formed at the front surface of the substrate, wherein the charge readout node is configured to receive the accumulated photo-generated charge from the charge storage region;
   a first reset transistor formed on the front surface of the substrate and coupled to the charge readout node; and
   a second reset transistor formed on the front surface of the substrate and coupled to the charge readout node through a capacitor.

2. The image sensor pixel circuitry defined in claim 1, wherein the first reset transistor has a first gate terminal coupled to a first pixel reset line and wherein the second reset transistor has a second gate terminal coupled to a second pixel reset line.

3. The image sensor pixel circuitry defined in claim 1, wherein the charge readout node comprises a floating diffusion node at the front surface of the substrate.

4. The image sensor pixel circuitry defined in claim 3, further comprising:
   a source follower transistor formed at the front surface of the substrate and coupled to the floating diffusion node.

5. The image sensor pixel circuitry defined in claim 4, further comprising:
   column feedback amplifier circuitry coupled to the floating diffusion node through the source follower transistor.

6. The image sensor pixel circuitry defined in claim 5, wherein the column feedback amplifier circuitry has an output and wherein the image sensor pixel circuitry further comprises:
   a column feedback line coupled between the output of the column feedback amplifier circuitry and the first and second reset transistors.

7. The image sensor pixel circuitry defined in claim 6, wherein the output of the column feedback amplifier circuitry is coupled to a column signal line and wherein the image sensor pixel circuitry further comprises:
   active negative capacitance circuitry coupled to the column signal line.

8. The image sensor pixel circuitry defined in claim 6, further comprising:
   active negative capacitance circuitry coupled to the column feedback line.

9. The image sensor pixel circuitry defined in claim 8, wherein the active negative capacitance circuitry comprises:
   an amplifier circuit having an input and an output; and
   a capacitor coupled between the input and the output of the amplifier circuit.

10. The image sensor pixel circuitry defined in claim 5, wherein the column feedback amplifier circuitry has a first input coupled to the source follower, a second input coupled to a voltage reference, and an output, wherein the image sensor pixel circuitry further comprises:
    a first switch coupled between the first input and the output of the column feedback amplifier circuitry;
    a second switch coupled between the first input and the output of the column feedback amplifier circuitry in parallel with the first switch; and
    a capacitor coupled between the first input and the output of the column feedback amplifier circuitry in series with the second switch.

11. The image sensor pixel circuitry defined in claim 3, wherein the second reset transistor and the capacitor are coupled together at an intermediate node and wherein the image sensor pixel circuitry further comprises:
    a reference power supply line; and
    a bypass capacitor coupled between the intermediate node and the reference power supply line.

12. The image sensor pixel circuitry defined in claim 11, wherein the first reset transistor is configured to reset the floating diffusion node to a reset voltage and wherein the second reset transistor is configured to reset the intermediate node to the reset voltage including a kTC-reset noise correcting voltage associated with the first reset transistor.

13. The image sensor pixel circuitry defined in claim 1, further comprising:
    a charge transfer gate formed on the front surface of the substrate, wherein the charge transfer gate is configured to transfer the accumulated photo-generated charge from the charge storage region to the charge readout node;

a blooming drain region formed at the front surface of the substrate; and a blooming control gate formed on the front surface of the substrate, wherein the blooming control gate is configured to transfer overflow charge from the charge storage region to the blooming drain region.

14. The image sensor defined in claim 1, further comprising:

a color filter, wherein the color filter is formed over the back surface of the substrate.

15. A method for operating an image sensor having an array of image sensor pixels, wherein the array comprises a substrate having opposing front and back surfaces, the method comprising:

with a charge storage region formed at the back surface of the substrate, accumulating photo-generated charge;

with a charge readout node formed at the front surface of the substrate, receiving the accumulated photo-generated charge from the charge storage region, wherein the charge readout node is coupled to column feedback amplifier circuitry, wherein an output of the column feedback amplifier circuitry is coupled to the charge readout node through first and second reset transistors;

with a charge transfer gate formed on the front surface of the substrate, transferring the accumulated photo-generated charge from the charge storage region to the charge readout node based on a global shutter algorithm; and with the column feedback amplifier circuitry, supplying an output voltage to the first and second reset transistors.

16. The method defined in claim 15, wherein the second reset transistor is coupled to the charge readout node through a coupling capacitor and wherein the second reset transistor and the coupling capacitor are coupled together at an intermediate node, the method further comprising:

with the first reset transistor, resetting the charge readout node to the output voltage; and with the second reset transistor, resetting the intermediate node to the output voltage including a correction for kTC-reset noise associated with resetting the charge readout node to the output voltage.

17. The method defined in claim 16, wherein an input of the column feedback amplifier circuitry is coupled to the charge readout node through a source follower transistor, the method further comprising:

with the column feedback amplifier circuitry, receiving image signals from the source follower transistor; and with the column feedback amplifier circuitry, providing an adjustable gain for the received image signals.

18. The method defined in claim 15, wherein the charge readout node is coupled to a column output line through a source follower transistor, wherein the column output line is coupled to active negative capacitance circuitry, and wherein the column output line has an associated parasitic capacitance, the method further comprising:

with the active negative capacitance circuitry, mitigating the parasitic capacitance associated with the column output line.

19. The method defined in claim 15, wherein the array of image sensor pixels further comprises a blooming drain region and a blooming control gate formed at the front surface of the substrate and wherein the blooming control gate is shared between at least two image sensor pixels in the array, the method further comprising:

with the blooming control gate, transferring overflow charge from the charge storage region to the blooming drain region.

20. A system, comprising:

a central processing unit;

memory;

input-output circuitry; and an imaging device, wherein the imaging device comprises:

a pixel array having at least one pixel circuit, and a lens that focuses an image onto the pixel array, wherein the at least one pixel circuit comprises:

a substrate having opposing front and back surfaces;

a charge storage region formed at the back surface of the substrate, wherein the charge storage region is configured to accumulate photo-generated charge;

a charge readout node formed at the front surface of the substrate, wherein the charge readout node is configured to receive the accumulated photo-generated charge photo from the charge storage region;

a first reset transistor formed on the front surface of the substrate and coupled to the charge readout node;

a second reset transistor formed on the front surface of the substrate and coupled to the charge readout node; and a source follower transistor formed at the front surface of the substrate and coupled to the charge readout node, wherein the source follower transistor is coupled to an input of a feedback amplifier and wherein the feedback amplifier is configured to output a voltage level to the first and second reset transistors.

21. The system defined in claim 20, wherein the at least one pixel circuit further comprises:

a coupling capacitor coupled between the second reset transistor and the charge readout node, wherein the second reset transistor and the coupling capacitor are coupled together at an intermediate node, wherein the first reset transistor is configured to reset the charge readout node to the voltage level and wherein the second reset transistor is configured to reset the intermediate node to the voltage level.

* * * * *